United States Patent
Chien

(10) Patent No.: US 6,841,882 B2
(45) Date of Patent: Jan. 11, 2005

(54) ELASTOMER INTERPOSER FOR GRID ARRAY PACKAGES AND METHOD OF MANUFACTURING THE SAME

(75) Inventor: Ray Chien, Taipei (TW)

(73) Assignee: VIA Technologies, Inc., Taipei (TW)

( * ) Notice: Subject to any disclaimer, the term of this patent is extended or adjusted under 35 U.S.C. 154(b) by 266 days.

(21) Appl. No.: 10/293,564

(22) Filed: Nov. 14, 2002

(65) Prior Publication Data

US 2003/0146510 A1 Aug. 7, 2003

(30) Foreign Application Priority Data

Feb. 7, 2002 (TW) ......................................... 9112286 A

(51) Int. Cl.[7] .......................... H01L 23/00; H01R 12/00; H01R 13/40; H01K 4/58
(52) U.S. Cl. ................... 257/777; 257/E23.001; 439/66; 439/71; 439/91; 439/591; 361/719; 361/866
(58) Field of Search .................. 257/777, E23.001; 439/66, 71, 91, 591; 361/719; 324/767, 757; 29/830, 852

(56) References Cited

U.S. PATENT DOCUMENTS

| | | | | |
|---|---|---|---|---|
| 4,003,621 A | * | 1/1977 | Lamp | ................... 439/586 |
| 4,249,302 A | * | 2/1981 | Crepeau | ................... 29/830 |
| 4,932,883 A | | 6/1990 | Hsia et al. | |
| 5,071,359 A | * | 12/1991 | Arnio et al. | ................... 439/91 |
| 5,245,751 A | * | 9/1993 | Locke et al. | ................... 29/852 |
| 5,427,535 A | * | 6/1995 | Sinclair | ................... 439/66 |
| 5,828,226 A | * | 10/1998 | Higgins et al. | ................... 324/762 |
| 6,264,476 B1 | * | 7/2001 | Li et al. | ................... 439/66 |
| 6,663,399 B2 | * | 12/2003 | Ali et al. | ................... 439/66 |
| 6,712,620 B1 | * | 3/2004 | Li et al. | ................... 439/63 |
| 6,722,893 B2 | * | 4/2004 | Li et al. | ................... 439/66 |

* cited by examiner

Primary Examiner—John F. Niebling
Assistant Examiner—Ron Pompey
(74) Attorney, Agent, or Firm—Birch, Stewart, Kolasch & Birch, LLP

(57) ABSTRACT

An elastomer interposer employed between a package and a printed circuit board and the method of manufacturing the same are disclosed. The elastomer interposer includes an elastomer, a plurality of conductive wires, Cu pads, solder resistant blocks and Ni/Au plated pads. The elastomer has two contact surfaces. The conductive wires are arranged inside the elastomer at a certain interval and tilted toward one of the contact surfaces with an inclined angle. The Cu pads are formed on both of the surfaces at a space, and electrically connected to the corresponding conductive wires. Also, the Ni/Au plated pads are formed over the Cu pads.

17 Claims, 14 Drawing Sheets

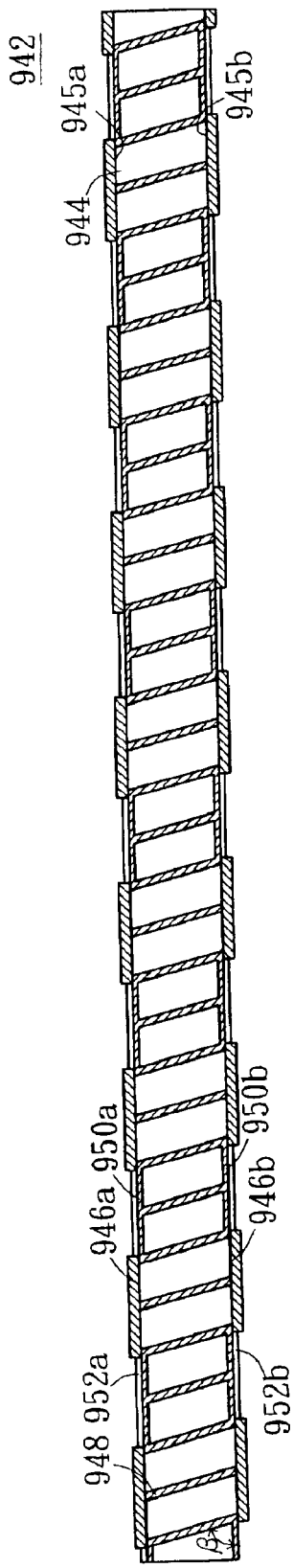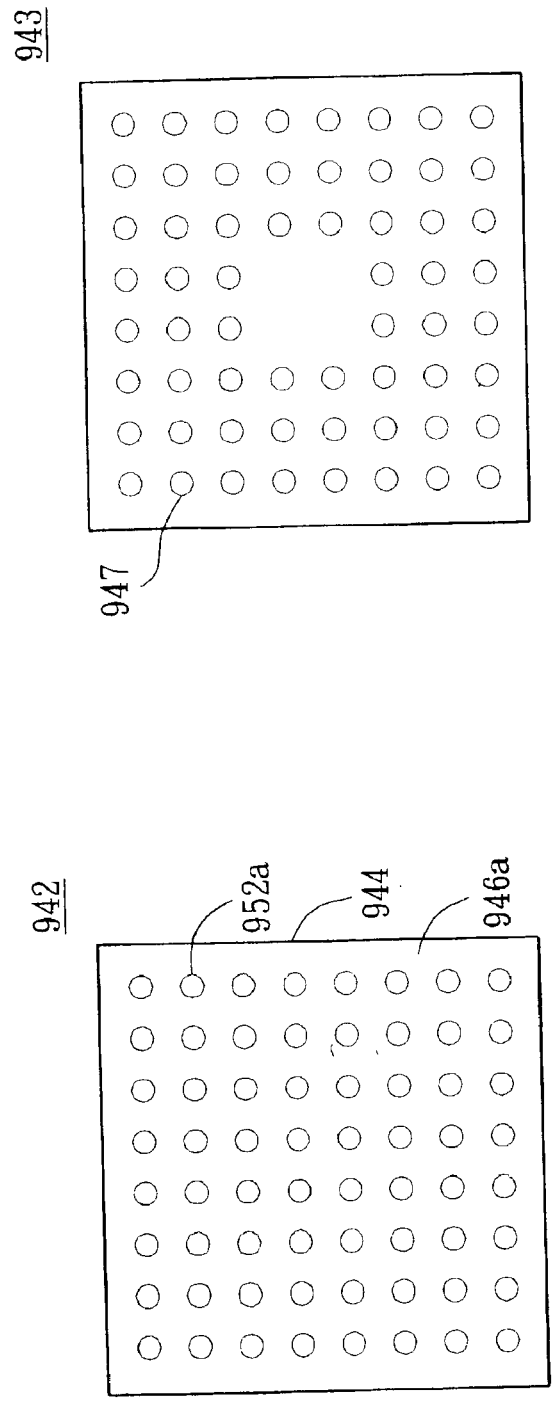
FIG. 12A
FIG. 12B
FIG. 12C

US 6,841,882 B2

ELASTOMER INTERPOSER FOR GRID ARRAY PACKAGES AND METHOD OF MANUFACTURING THE SAME

This application incorporates by reference of Taiwan application Serial No. 091102286, filed Feb. 7, 2002.

BACKGROUND OF THE INVENTION

1. Field of the Invention

The invention relates in general to an elastomer interposer employed between the package and PCB and the method of manufacturing the same, and more particularly to an elastomer interposer functioning as a strain reliever for the solder balls between the package and the PCB, thus greatly enhance the reliability of the package against the thermal cycle failure.

2. Description of the Related Art

The integrated circuit (IC) devices can be packaged by a variety of the exterior packaging materials, so that IC can be mounted on the printed circuit board (PCB) and the functions of IC and heat dissipation are also achieved. In assembling IC onto the PCB, the conventional method of pin through hole (PTH) is mostly replaced by the surface mount technology (SMT), in order to increase the assembly efficiency and density of IC package.

The PTH method means that the insertion of component leads into via holes on the PCB for connecting and soldering the IC to the PCB. Dual inline package (DIP) is one sort of PTH-style assembly. The SMT method means that IC is soldered onto the PCB at high temperature by the solder balls or solder pastes on the PCB pads, instead of insertion of component leads. Due to its great potentials in reducing the PCB size, decreasing the production cost and raising the yield of production, the SMT-style assembly has become the mainstream in the IC packaging technology. Also, the packages suitable for SMT-style assembly could be the Grid Array (GA) packages, such as Pin Grid Array (PGA), Ball Grid Array (BGA) and Land Grid Array (LGA) packages.

FIG. 1A depicts the cross-sectional drawing of a conventional LGA packages. The package 102 includes the IC 104, substrate 106, molding compound 108, and gold wires 110a and 110b. The bottom surface 104b of the IC 104 adheres to the top surface 106a of the substrate 106 by the silver epoxy 112. The top surface 104a of the IC 104 which has the IC input/output (I/O) pads is electrically connected to the substrate 104 by the gold wires 110a and 110b. In FIG. 1A, the gold wires 110a and 110b connect the IC 104 and the openings (in that is electroplated with Ni/Au and named bonding finger)of the solder resistant layer 118a of the substrate 106. The substrate 106 further includes the vias 114, Ni/Au plated contact land pads 116, and the solder resistant layers 118a and 118b. The solder resistant layers 118a and 118b are on the top surface 106a and the bottom surface 106b of the substrate 106, respectively. The Ni/Au plated contact land pads 116 are in the openings of the solder resistant layer 118b for improving the electrical connection. Also, the metal traces are distributed underneath the solder resistant layers 118a and 118b for electrically connecting in the vias 114, the Ni/Au plated contact land pads 116 and the gold wires 110a and 110b. Also, the vias 114 created between the solder resistant layers 118a and 118b and the traces, are to electrically connect the Ni/Au plated contact land pads 116 and the gold wires 110a and 110b. Additionally, the molding compound 108, which is formed over the substrate 106 and made from high humidity-resistance material, encapsulates the IC 104 and the gold wires 110a and 110b for the purpose of protecting the wire bonded IC. The molding compound 108 not only prevents the wire bonded IC from corrosion (mainly caused by air and humidity), but also reduce the chance of physical destruction of the IC 104.

The Ni/Au plated contact land pads 116 form an array in the openings of the solder resistant layer 118b, as the name LGA (Land Grid Array) implies. If the solder balls are further attached onto the Ni/Au plated contact land pads 116, the package 102 becomes a BGA-style package 122, as shown in FIG. 1B. FIG. 1B is a schematic drawing of BGA package, and it clearly depicts the positions of the solder balls 120. Furthermore, the package 122 is named as a plastic ball grid array (PBGA) package if the substrate 106 and the molding compound 108 are made by organic materials. Similarly, the package 122 is named as a ceramic ball grid array (CBGA) package if the substrate 204 and the top lid 206 are made by ceramics.

FIG. 2 depicts a cross-sectional drawing of a CBGA package and a PCB. The CBGA package 202 includes a CBGA substrate 204 and a ceramic lid 206. The ceramic lid 206 glued over the top surface 204 of the CBGA substrate 204 functions as a hermetic seal. The solder balls 208 attached to the bottom surface 204b of the CBGA substrate 204 are joined to the solder ball pads 212 on the PCB 210 (along the direction of the arrow 220) at a high temperature. The coefficient of thermal expansion (CTE) of the CBGA substrate 204 is approximately 8 ppm/° C., while the CTE of the PCB 210 is approximately 18 ppm/° C. Therefore, the CBGA substrate 204 can not be reliably mounted on the epoxy-based PCB 210 due to the solder ball crack (stress fatigue) problem from future thermal cycles, of which is originated from the CTE mismatch between the PCB 210 and the CBGA package 202. According to the CTE mismatch between the PCB 210 and the CBGA package 202, during high-temperature bonding, the thermal expansion of the PCB 210 is greater than that of the ceramic substrate so as that there exerted two thermal stress on the solder balls 208 after cooling down. The solder balls 208 would crack and could not make the package 202 firmly mounted on the PCB 210.

FIG. 3 depicts a cross-sectional drawing of a PBGA package and a low-CTE PCB. In FIG. 3, the PBGA package 302 includes a PBGA substrate 304 and a molding compound 306. The molding compound 306 is formed over the top surface 304 of the PBGA substrate 304. The solder balls 308 attached to the bottom surface 304b of the PBGA substrate 304 are joined to the solder ball pads 312 on the PCB 310 (along the direction of the arrow 320) at a high temperature. The CTE of the PBGA substrate 304 is approximately 18 ppm/° C., larger than that of the low-CTE PCB 310, approximately 5~10 ppm/° C. Therefore, the PBGA substrate 304 can not be reliably mounted on the epoxy-based PCB 310 due to the solder ball crack (stress fatigue) problem from future thermal cycles, of which is originated from the CTE mismatch between the PCB 310 and the PBGA package 302.

An elastomeric connector to connect integrated circuit chips in a microcircuit package for permanent interconnection or testing purposes is disclosed in U.S. Pat. No. 4,932, 883, "Elastomeric connectors for electronic packaging and testing", Hsia, et al. FIG. 4 is a cross-sectional drawing of an assembled IC, elastomeric connector and test substrate. The elastomeric connector 402 includes the elastomeric base 406, the through-hole conductors 408 and the surface conductor tabs 410. The elastomeric base 406 is placed over the top surface 404a of the test substrate 404. The through-hole conductors 408 are embedded in the elastomeric base 406 and vertically attached to the top surface 404a of the test substrate 404. The through-hole conductors 408 make direct contact with the metal lines of the test substrate 404. The surface conductor tabs 410 exist on the top surface of the elastomeric base 406 and are connected to each of the through-hole conductors 408. The plates 416a and 416b clip the IC 412, the elastomeric connector 402 and the test substrate 404 by a clamping means such as the screws 418a and 418b. The through-hole conductors 408 are not deformed, while the surface conductor tabs 410 slightly bend due to the downward pressure. The elastomeric base 406 is also deformed by the clamping force of the plates 416a and 416b, so that the I/O pads (I/O solder balls) 414 can make good electrical contact with the surface conductor tabs 410.

Since the I/O pads (I/O solder balls) 414 contact with the surface conductor tabs 410 instead of soldering, thermal expansion and contraction of the IC 412, elastomeric connector 402 and test substrate 404 caused by temperature change has no effect on the electrical connection between the I/O pads 414 and the surface conductor tabs 410. This configuration will turn the CTE differences between the IC 412, elastomeric connector 402 and test substrate 404 into an insignificant factor, and the I/O solder balls 414 crack from thermal stress can be prevented.

Since only one through-hole conductors 408 for one surface conductor tabs 410, the numbers of disposed I/O solder balls 414 and through-hole conductors 408 are limited; consequently, the elastomeric connector 402 is only suitable and applicable to a package which has the I/O solder balls 414 as many as the through-hole conductors 408. Besides, only small area of the elastomeric connector 402 (the portion beneath the surface conductor tabs 410) bears the clamping force. The through-hole conductors 408 and the surface conductor tabs 410, made by metal and with little elasticity, could be damaged or even broken when the assembly suffers from an over large clamping force or collision. Moreover, the surface conductor tabs 410 are disposed over the top surface of elastomeric base 406 only. The bottom surface 404a has no surface conductor tabs 410 and the application of this elastomeric connector 402 is therefore limited. Also, no surface insulating layer is adopted in the elastomeric connector 402 to isolate adjacent surface conductor tabs 410, and this may easily introduce short circuit and poor humidity resistance reliability.

SUMMARY OF THE INVENTION

It is therefore an objective of this invention to provide an elastomer interposer employed between a package and a printed circuit board, and the method of manufacturing the same. The elastomer interposer design of the present invention not only facilitates the electrical connection between the package and the PCB, but also protects the components in the package from destruction by the external force. Additionally, the elastomer interposer functions as a strain reliever for the solder balls between the package and the PCB, thus greatly enhance the reliability of the package against thermal cycle failure. Besides, the elastomer interposer could be electrically connected to the package and the PCB by the solder balls or the conductive bumps, depending on the applied package and PCB styles.

The invention achieves the above-mentioned objectives by providing an elastomer interposer employed between a package and a printed circuit board. The elastomer interposer includes an elastomer, a plurality of conductive wires, Cu pads, solder resistant layers and Ni/Au plated pads. The elastomer has a first surface and a second surface. The conductive wires are arranged inside the elastomer at a certain interval and tilted toward the second surface with an inclined angle. The first Cu pads and the second Cu pads are formed on the first surface and the second surface at a space, respectively. Also, the first Cu pads are electrically connected to the second Cu pads by the corresponding conductive wires in between. Additionally, the first solder resistant layer with its opening surrounding the first Cu pads are on the first surface, and the second solder resistant layer with its opening surrounding the second Cu pads are on the second surface. A plurality of first Ni/Au plated pads and second Ni/Au plated pads are respectively formed over the first Cu pads and the second Cu pads.

Another objective of the invention is to provide a method of manufacturing an elastomer interposer, which is employed between a package and a printed circuit board. First, an elastomer that has a first surface, a second surface and a plurality of conductive wires therein is provided. The conductive wires are arranged inside the elastomer at a certain interval and tilted toward the second surface with an inclined angle. Next, the elastomer is etched to expose two ends of the conductive wires, which two ends are protruded from the first surface and the second surface. Then, a Cu coating layer is formed over the elastomer. Subsequently, the Cu coating layer is patterned by photolithography, to form a plurality of first Cu pads and second Cu pads respectively on the first surface and the second surface at a space. Also, the first Cu pads are electrically connected to the second Cu pads by the corresponding conductive wires in between. Afterward, a plurality of first solder resistant layer and second solder resistant layer are respectively formed on the first surface and the second surface, wherein the first solder resistant layer has openings surrounding the first Cu pads on the first surface, and the second solder resistant layer has openings surrounding the second Cu pads are on the second surface. Last, a plurality of first Ni/Au plated pads are formed over the first Cu pads, and a plurality of second Ni/Au plated pads are formed over the second Cu pads.

A further objective of the invention is to provide another method of manufacturing elastomer interposer. First, an elastomer that has a first surface, a second surface and a plurality of conductive wires therein is provided. The conductive wires are arranged inside the elastomer at a certain interval and tilted toward the second surface with an inclined angle. Next, a plurality of first patterned-PR blocks and second patterned-PR blocks are respectively formed on the first surface and the second surface by photolithography method, which the first and the second patterned-PR blocks are kept in a space after exposure and development. Then, the elastomer is surface etched to expose two ends of the conductive wires protruding from the first surface and the second surface. Next, a Cu coating layer is formed over the elastomer and the patterned-PR blocks. Subsequently, the first and the second patterned-PR blocks and Cu coating thereon are removed to form a plurality of first Cu pads and second Cu pads respectively on the first surface and the second surface at a space, known as a lift-off process. Also, the first Cu pads are electrically connected to the second Cu pads through the corresponding conductive wires in between. Afterward, a plurality of first solder resistant layer and second solder resistant layer are respectively formed on the first surface and the second surface, wherein the first solder resistant layer has openings surrounding the first Cu pads are on the first surface, and the second solder resistant layer has openings surrounding the second Cu pads are on the second surface. Last, a plurality of first Ni/Au plated pads are formed over the first Cu pads and a plurality of second Ni/Au plated pads are formed over the second Cu pads.

Other objects, features, and advantages of the invention will become apparent from the following detailed description of the preferred but non-limiting embodiment. The following description is made with reference to the accompanying drawings.

BRIEF DESCRIPTION OF THE DRAWINGS

FIG. 12A is a cross-sectional drawing of an elastomer interposer according to the second embodiment of the invention;

FIG. 12B is a top view of the elastomer interposer of FIG. 12A;

FIG. 12C is a top view of an elastomer interposer in the second embodiment, which the Ni/Au plated pads form a partial matrix without pads in the center area of the elastomer interposer; and FIG. 13A~

DETAILED DESCRIPTION OF THE INVENTION

An elastomer interposer employed between the printed circuit board (PCB) and the package, especially grid array (GA) package, is disclosed in the present invention. The packaging industry has been struggling for the CTE (coefficient of thermal expansion) mismatch between the package and PCB. The elastomer interposer functions as a strain reliever for the solder balls between the package and the PCB, thus greatly enhance the reliability of the package against thermal cycle failure. The elastomer interposer could be connected to the package and PCB by the solder balls or the conductive bumps, depending on the applied package and PCB styles.

Also, the invention can be used for a variety of GA package types, such as a pin grid array (PGA) package, a column grid array (CGA) package, a ball grid array (BGA) package, and a land grid array (LGA) package. The BGA packages can be divided into two groups—the ceramic ball grid array (CBGA) package and plastic ball grid array (PBGA) package, according to the material of substrate of the package. Additionally, the invention can be used for other GA package types, such as a ceramic pin grid array (CPGA) package or a ceramic column grid array (CCGA) package. The elastomer interposer of the present invention are now described in further detail with reference to the drawings which illustrate the first and second embodiments within the scope of the invention.

First Embodiment

Figure 1A:
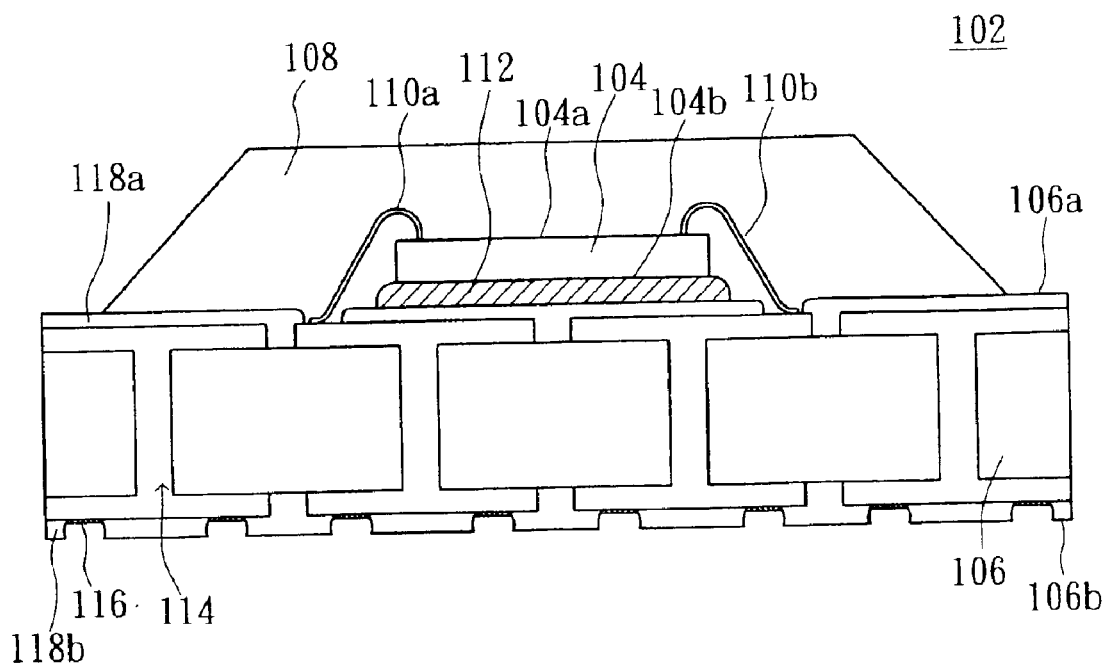
FIG. 1A (prior art) depicts the cross-sectional drawing of a conventional LGA packages.
Figure 1B:
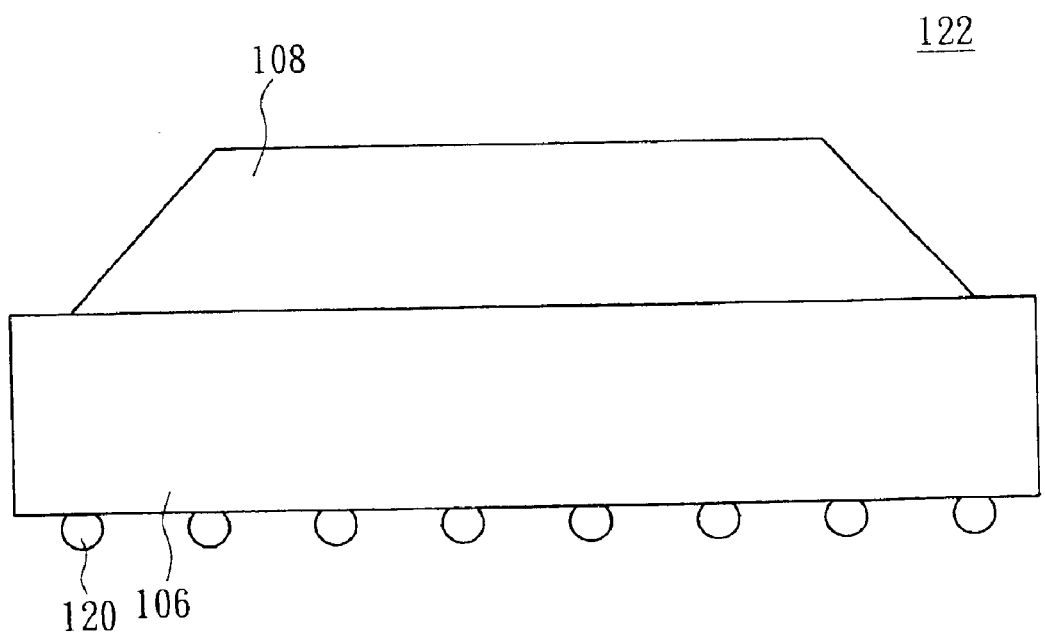
FIG. 1B (prior art) is a schematic drawing of BGA package showing the attached solder balls of FIG. 1A.
Figure 2:
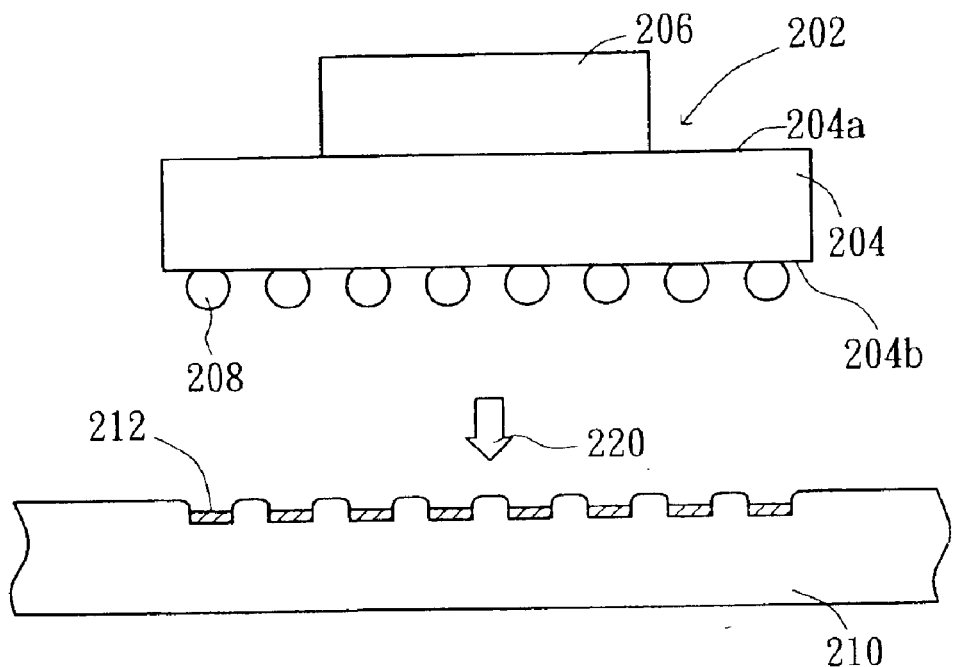
FIG. 2 (prior art) depicts a cross-sectional drawing of a CBGA package and a PCB.
Figure 3:
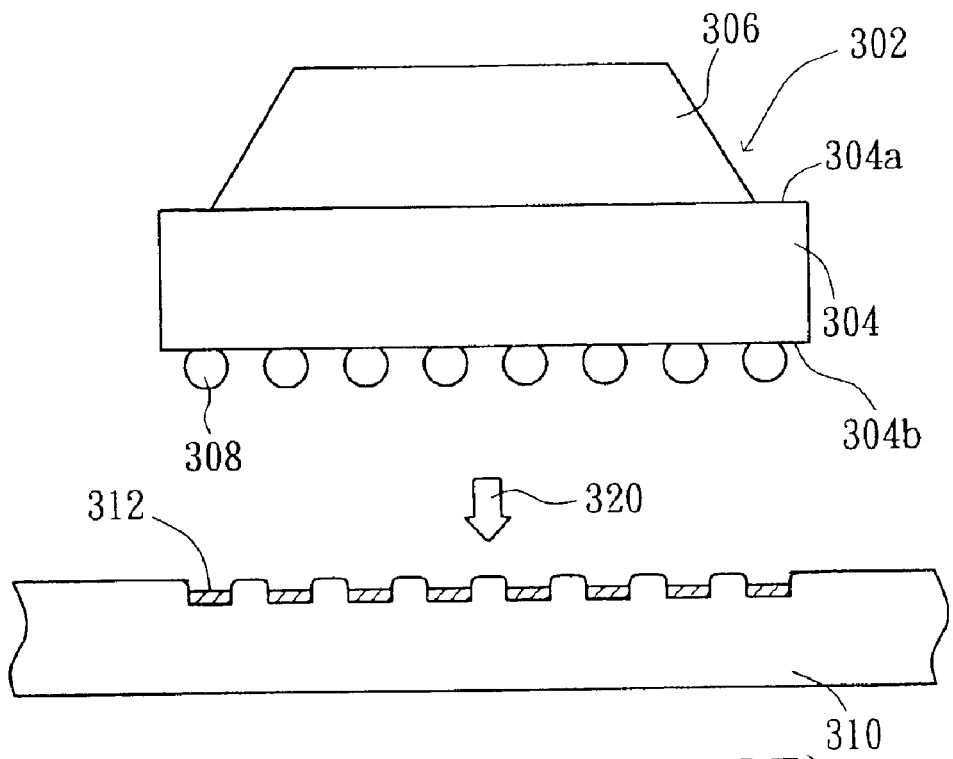
FIG. 3 (prior art) depicts a cross-sectional drawing of a PBGA package and a low-CTE PCB.
Figure 4:
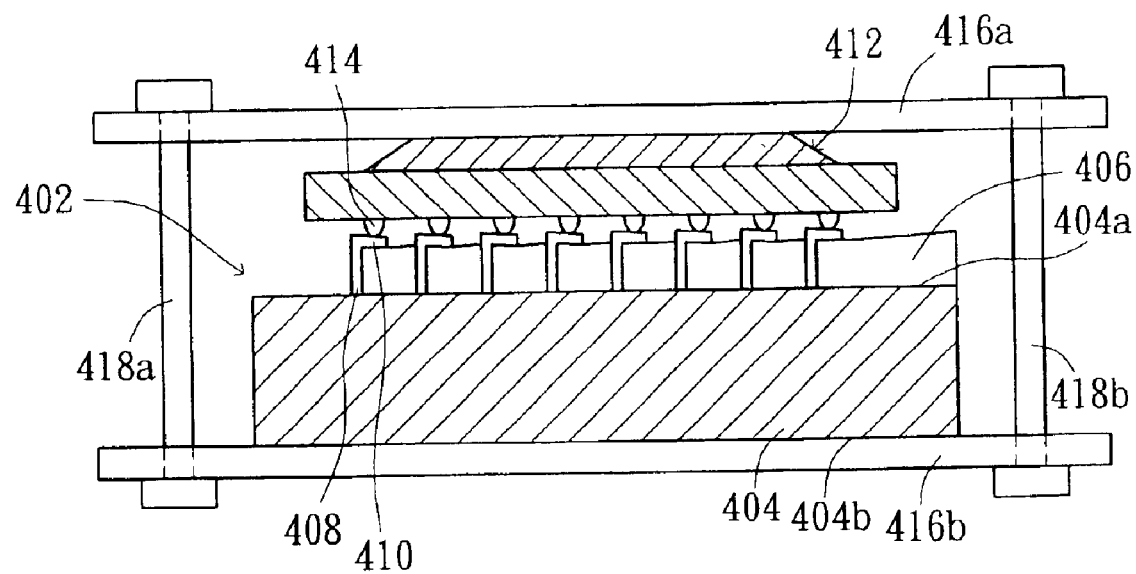
FIG. 4 (prior art) is a cross-sectional drawing of an assembled IC, elastomeric connector and test substrate.
Figure 5A:
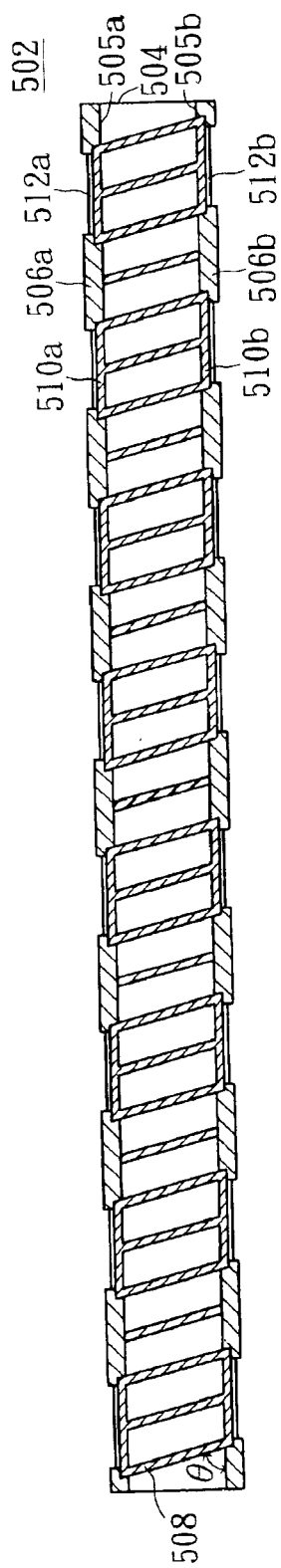
FIG. 5A is a cross-sectional drawing of an elastomer interposer according to the first embodiment of the invention.

FIG. 5A is a cross-sectional drawing of an elastomer interposer according to the first embodiment of the invention. The elastomer interposer 502 includes an elastomer 504, the solder resistant layers (insulating layers) 506a and 506b, numerous parallel, conductive wires 508, the conductive pads and solder ball pads, wherein the conductive pads could be the Cu pads 510a and 510b, the solder ball pads could be the Ni/Au plated pads 512a and 512b for the improvement of electrical connection and solder joint reliability. The elastomer 504 having the top surface 505a and bottom surface 505b in parallel provides the flexibility of elastomer interposer 502. The solder resistant layer 506a having openings surrounding the Ni/Au plated pads 512a are on the top surface 505a of the elastomer 504, while the solder resistant layer 506b having openings surrounding Ni/Au plated pads 512b are on the bottom surface 505b of the elastomer 504.

Also, the Cu pads 510a are plated to become the Ni/Au plated pads 512a, while the Cu pads 510b are plated to become the Ni/Au plated pads 512b. Thus, the configurations of top surface 505a and bottom surface 505b are symmetric. The solder resistant layer 506a insulates the Ni/Au plated pads 512a from adjacent Ni/Au plated pads 512a, while the solder resistant layer 506b insulates the Ni/Au plated pads 512b from adjacent Ni/Au plated pads 512b. The solder resistant layers 506a and 506b not only have insulating function, but also protect the inner structure of the elastomer interposer 502. The solder resistant layers 506a and 506b can be made of any organic insulating ink, with high temperature enduring (endurance at about 250° C. for 30 secs) and water resistant properties.

The surface where the Cu pads 510a and Ni/Au plated pads 512a interface is beyond the level of the top surface 505a (the interface between the solder resistant layers 506a and the elastomer) of the elastomer 504. Similarly, the surface where the Cu pads 510b and Ni/Au plated pads 512b interface is beyond the level of the top surface 505b (the interface between the solder resistant layers 506b and the elastomer) of elastomer 504. It is noted that the conductive wires 508 are arranged parallel at a certain interval, and the tilts between the conductive wires 508 and bottom surface 505b are kept in an angle of θ; accordingly, the tilted conductive wires 508 are orderly aligned in the elastomer 504. Each Cu pad 510a is electrically connected to the opposite, corresponding Cu pad 510b by the associated conductive wires 508 between them, usually 3~6 wires. Also, the elastomer 504 is made by the material selected from the group consisting of silicon rubber compound, polyurethane compound, polyethylene compound, synthetic rubber, polysiloxane resin compound, acrylic compound or polyolefins compound.

Figure 5C:
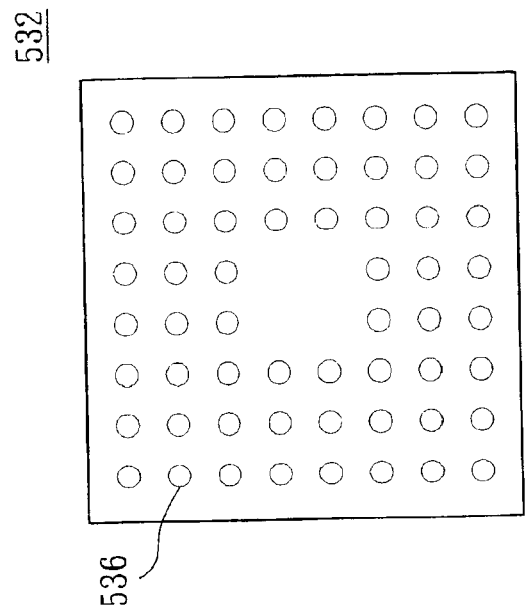
FIG. 5C is a top view of an elastomer interposer in the first embodiment, of which the Ni/Au plated pads form a partial matrix without pads in the center area of the elastomer interposer.
Figure 5B:
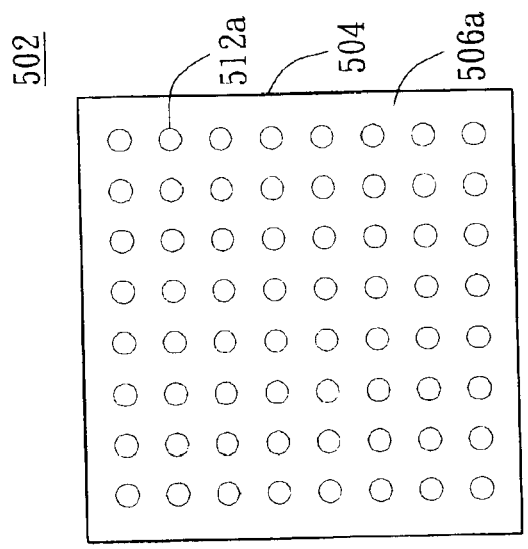
FIG. 5B is a top view of the elastomer interposer of FIG. 5A.

FIG. 5B is a top view of the elastomer interposer of FIG. 5A. In FIG. 5B, the Ni/Au plated pads 512a forms a full pad matrix in the openings of the solder resistant layer 506a. Similarly, the Ni/Au plated pads 512b forms a full pad matrix in the openings of the solder resistant layer 506b, too. Alternatively, the Ni/Au plated pads 532 could form a partial pad matrix with on pads in the center area of the elastomer interposer 532, as shown in FIG. 5C.

Figure 6A:
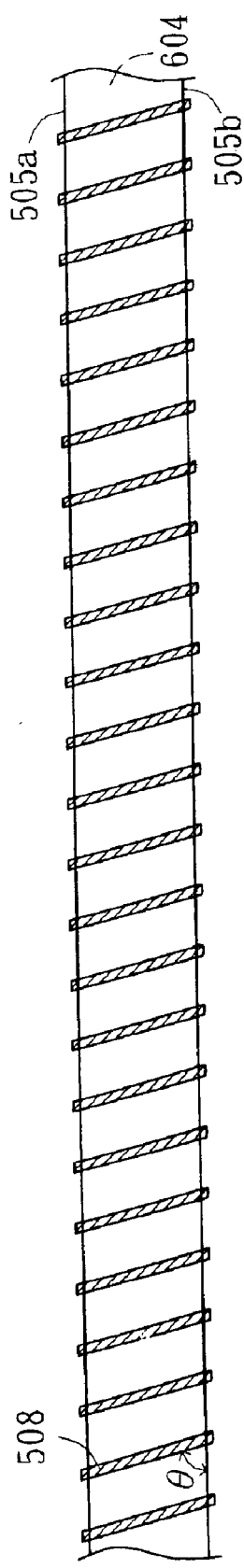
FIG. 6A~FIG. 6E illustrates a manufacturing process of the elastomer interposer of FIG. 5A.

FIG. 6A~FIG. 6E illustrates a manufacturing process of the elastomer interposer of FIG. 5A. First, a bare, anisotropically conducting elastomer 604 with numerous conductive wires 508 therein is provided. Then, surface etching is performed on the elastomer 604 to expose the conductive wires 508, as shown in FIG. 6A. Two ends of the conductive wires 508 protrude from the top surface 505a and the bottom surface 505b of the elastomer 604. It is noted that the conductive wires 508 are aligned parallel at a certain interval and the tilts between the conductive wires 508 and bottom surface 505b are kept in an angle of θ. Moreover, surface clean/pre-treatment could be performed after etching step, to remove the remaining organic material or oxidized layer on the elastomer 604 and the conductive wires 508.

Figure 6B:
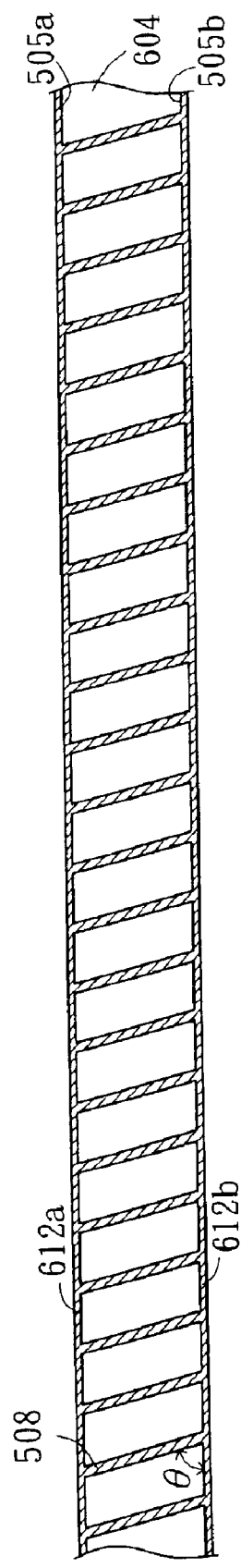

Referring to FIG. 6B, electroless chemical plating is performed on the elastomer 604, to form the Cu coating layers 612a and 612b on the top surface 505a and bottom surface 505b, respectively. Both of the Cu coating layers 612a and 612b are electrically connected with the conductive wires 508. Furthermore, the coated Cu layer could be formed over the outside surfaces of elastomer 604 as a wrap.

Figure 6C:
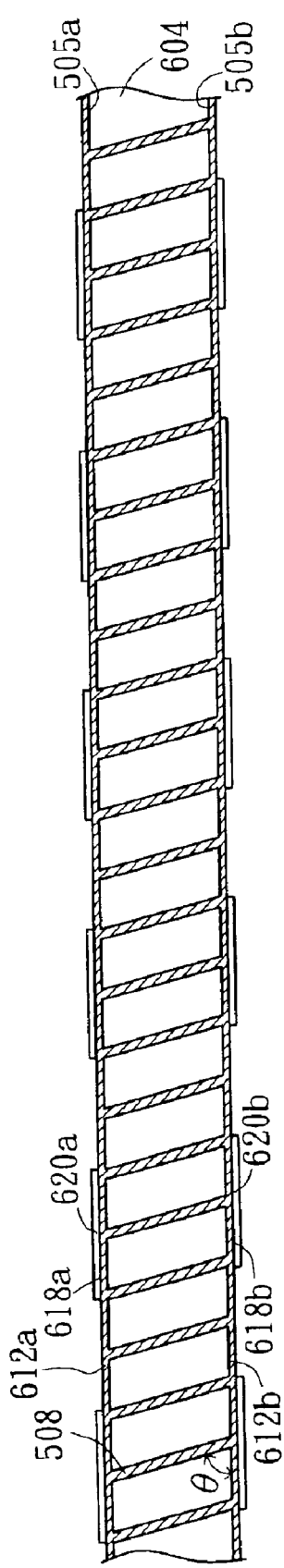

Referring to FIG. 6C, photolithography is performed on the Cu coating layers 612a and 612b. The photo-resist (PR) is deposited over the Cu coating layers 612a, and followed by exposure and development. The PR pattern 620a corresponding to the Cu pad area 618a is formed. Similarly, the PR pattern 620b corresponding to the Cu pad area 618b is formed. Thus, the Cu pad areas 618a and 618b of the coating layers 612a and 612b are defined.

Figure 6D:
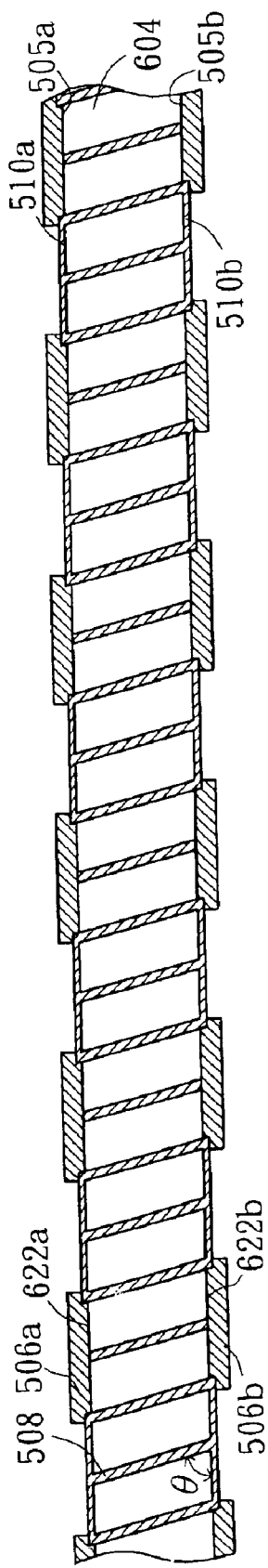

Referring to FIG. 6D, first a Cu pattern etching is performed after the PR-pattern formation. The portions of the Cu coating layers uncovered by the PR patterns 620a and 620b are etched away to form islands of the Cu pads 510a and 510b, and then the PR patterns 620a and 620b are removed. The discrete Cu pads 510a are arranged at certain interval, so do the Cu pads 510b. Each Cu pad 510a is electrically connected to the corresponding Cu pad 510b by the associated conductive wires 508 between them, usually 3~6 wires. Secondly, the solder resistant layer 506a is formed over the areas 622a surrounding the Cu pads 510a, while the solder resistant layer 506b is formed over the areas 622b surrounding the Cu pads 510b. Consequently, the solder resistant layer 506a with openings surrounding the Cu pads 510a are on the top surface 505a, while the solder resistant layer 506b with openings surrounding the Cu pads 510b are on the bottom surface 505b.

Figure 6E:
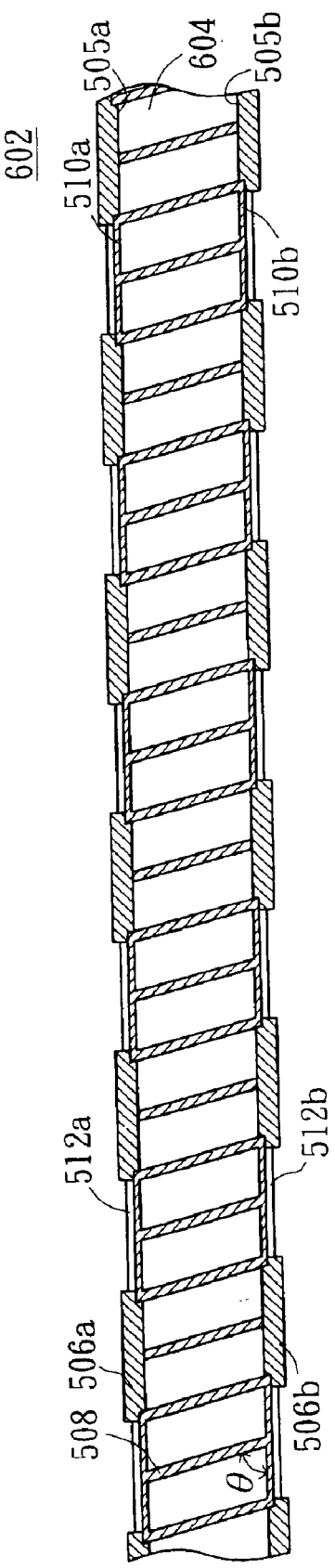

Referring to FIG. 6E, Ni/Au plated pads 512a and 512b are respectively formed over the Cu pads 510a and 510b by Ni/Au plating, and a (large sheet of) uncut elastomer interposers 602 are created. The Ni/Au plated pads 512a electrically contact with the Cu pads 510a, and the Ni/Au plated pads 512b electrically contact with the Cu pads 510b. After singulation (to form smaller pieces from a larger sheet) and inspection, a smaller piece like the elastomer interposer 502 of FIG. 5A is thus obtained.

In the present invention, the flexible elastomer 504 and tilted conductive wires 508 therein make the elastomer interposer 502 well support the package. The elastomer interposer disclosed herein functions as a strain reliever for the solder balls between the package and the PCB, thus greatly enhance the reliability of the package against thermal cycle failure and external force destruction. The applications of elastomer interposer of the first embodiment are now described in examples 1, 2, 3, 4 and 5 with reference to the drawings.

EXAMPLE 1

Figure 7:
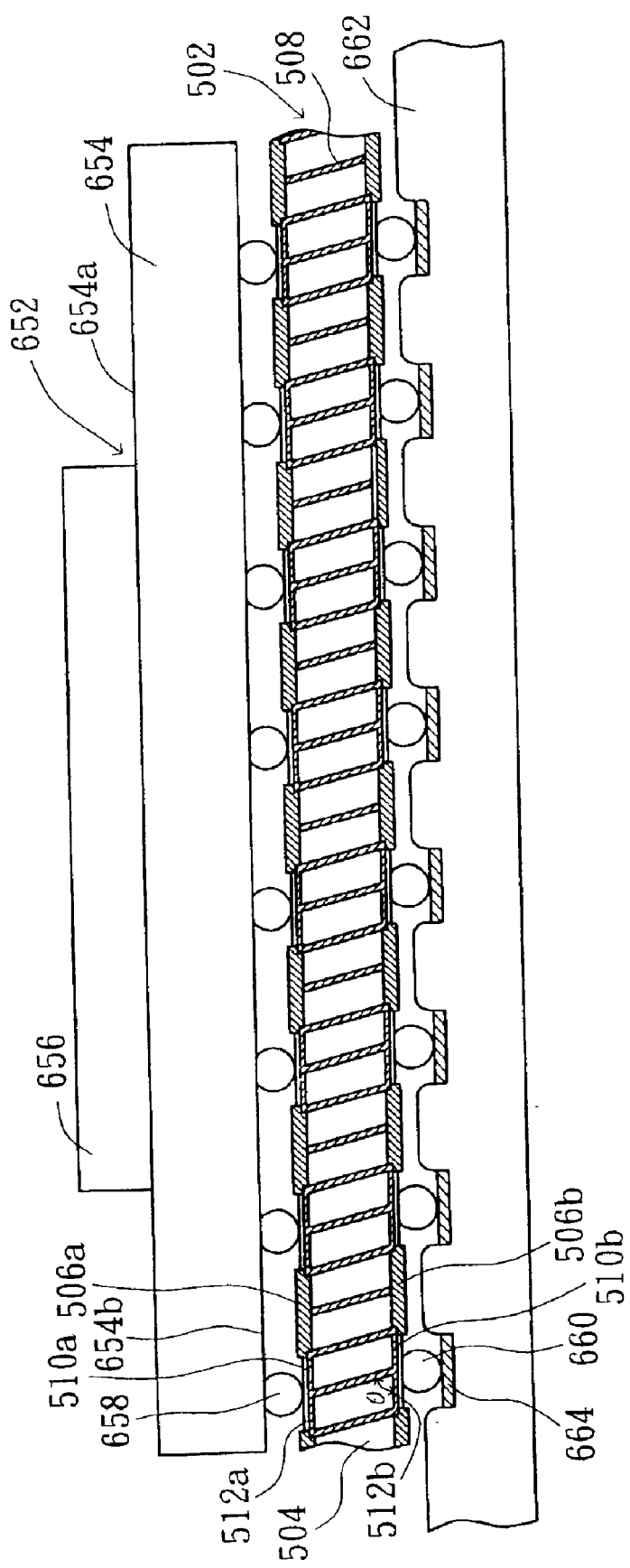
FIG. 7 is a cross-sectional drawing of the elastomer interposer employed between the PCB and CBGA package according to example 1 of the first embodiment of the invention.

FIG. 7 is a cross-sectional drawing of the elastomer interposer employed between the PCB and CBGA package according to example 1 of the first embodiment of the invention. In FIG. 7, the CBGA (ceramic ball grid array) package 652 includes a CBGA substrate 654 and a ceramic lid 656. The ceramic lid 656 formed over the top surface 654a of the CBGA substrate 654 functions as a hermetic seal. The solder balls 658 attached to the bottom surface 654b of the CBGA substrate 654 are soldered to the Ni/Au plated pads 512 at high temperature, and make a electrical connection between the CBGA package 652 and the elastomer interposer 502. Also, numerous solder balls 660 are attached to the Ni/Au plated pads 512b and soldered to the solder ball pads 664 on the PCB 662, to make an electrical connection between the elastomer interposer 502 and the PCB 662.

The coefficient of thermal expansion (CTE) of the CBGA substrate 654 is approximately 8 ppm/° C.; while the CTE of the PCB 662 is approximately 18 ppm/° C., larger than CBGA substrate 654. After the CBGA package 654 being soldered onto the elastomer interposer 502 and the elastomer interposer 502 being soldered onto the PCB 662, the thermal stress originated from the CTE mismatch between the CBGA package 654 and PCB 662 exerts different lateral stress on the solder balls 658 and 660. Consequently, the elastomer interposer 502 will be deformed (original rectangular turned to trapezium cross sectional wise) by unequal thermally induced strains on the two surfaces and therefore release the stress on the solder balls 658 and 660. The CBGA package 654 can be well mounted onto an epoxy-based PCB 662 without the solder ball crack (stress fatigue) reliability problem from thermal cycles.

Accordingly to the illustration in Example 1, the elastomer interposer 502 employed between the CBGA package 654 and PCB 662 functions as a strain reliever for the solder balls 658 (and 660), thus greatly enhance the reliability of the CBGA package 654 against thermal cycle failure.

EXAMPLE 2

Figure 8:
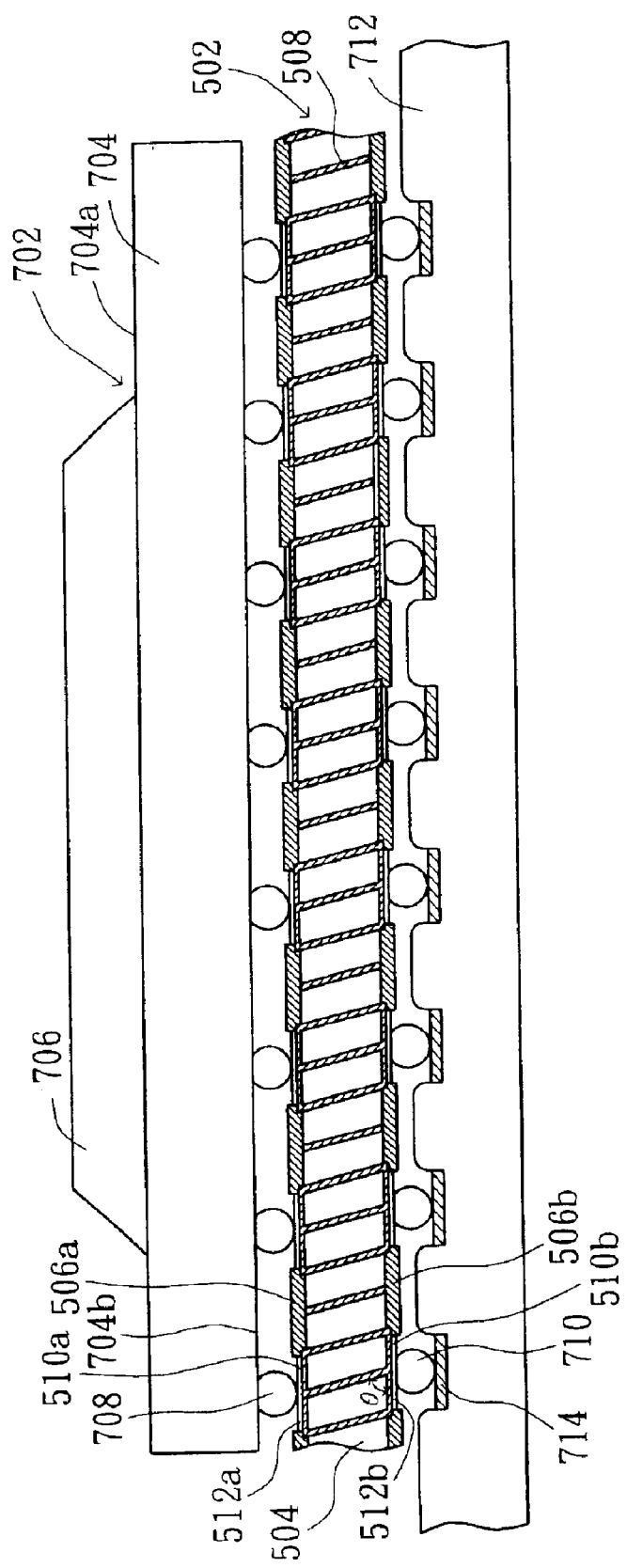
FIG. 8 is a cross-sectional drawing of the elastomer interposer employed between the low-CTE PCB and PBGA package according to example 2 of the first embodiment of the invention.

FIG. 8 is a cross-sectional drawing of the elastomer interposer employed between the low-CTE PCB and PBGA package according to example 2 of the first embodiment of the invention. In FIG. 8, the PBGA (plastic ball grid array) package 702 includes a PBGA substrate 704 and a molding compound 706. The molding compound 706 is formed over the top surface 704a of the PBGA substrate 704 and maintains the electric connection between the IC and the PBGA substrate 704. The solder balls 708 attached to the bottom surface 704b of the PBGA substrate 704 are soldered to the Ni/Au plated pads 512a of the elastomer interposer 502 at high temperature, and make an electrical connection between the PBGA package 702 and the elastomer interposer 502. Also, numerous solder balls 710 attached to the Ni/Au plated pads 512b are soldered to the solder ball pads 714 on the PCB 712, to make an electrical connection between the elastomer interposer 502 and the PCB 712.

The CTE of the PBGA substrate 704 is approximately 18 ppm/° C., larger than that of the low-CTE PCB 712, approximately 5~10 ppm/° C. After the PBGA package 704 soldered onto the elastomer interposer 502 and the elastomer interposer 502 soldered onto the PCB 712, the thermal stress originated from the CTE mismatch between the PBGA package 704 and PCB 712 exerts different lateral stress on the solder balls 708 and 714. Consequently, the elastomer interposer 502 will be deformed by unequal thermally induced strains on the two surfaces (original rectangular turned to trapezium cross sectional wise) and therefore release the stress on the solder balls 708 and 714. The PBGA package 704 can be well mounted onto an epoxy-based PCB 712 without the solder ball crack (stress fatigue) reliability problem from thermal cycles.

The invention herein can also be used for the other GA (grid array) packages, such as a CPGA (ceramic pin grid array) package, or a CCGA (ceramic column grid array) package. The elastomer interposer can be used between a CPGA package and an epoxy-based PCB. Pin tips or column tips are soldered onto the interposer pads first, then solder balls are applied to the other side of the interposer pads for SMT.

EXAMPLE 3

Figure 9:
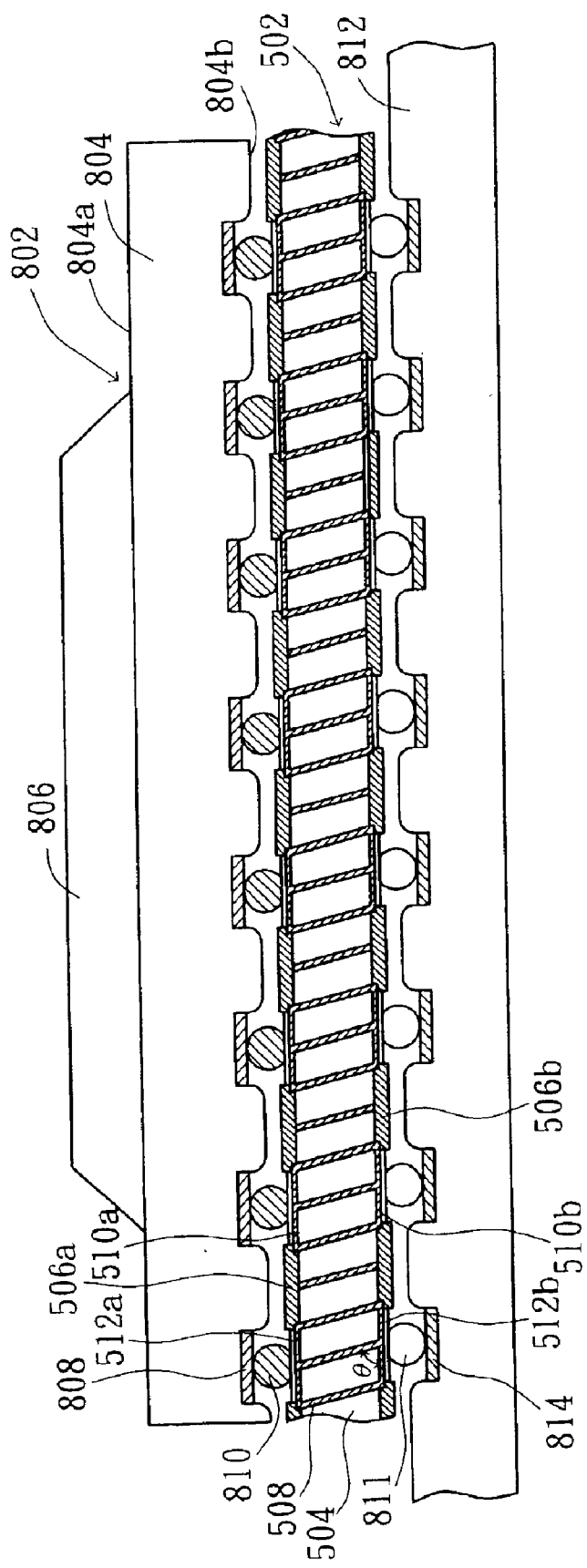
FIG. 9 is a cross-sectional drawing of the elastomer interposer employed between the PCB and LGA package according to example 3 of the first embodiment of the invention.

FIG. 9 is a cross-sectional drawing of the elastomer interposer employed between the PCB and LGA package according to example 3 of the first embodiment of the invention. In FIG. 9, the LGA (land grid array) package 802 includes a LGA substrate 804 and a molding compound 806. The molding compound 806 is formed over the top surface 804a of the LGA substrate 804 and maintains the electric connection between the IC and the LGA substrate 804. There are numerous Ni/Au plated pads 808 on the bottom surface 804b of the LGA substrate 804. Also, numerous solder balls 811 attached to the Ni/Au plated pads 512b of the elastomer interposer 502 are soldered to the solder ball pads 814 on the PCB 812, to make an electrical connection between the elastomer interposer 502 and the PCB 812.

Additionally, in another embodiment, the numerous conductive bumps 810 can be attached to the Ni/Au plated pads 512a of the elastomer interposer 502 and electrically connected to the Ni/Au plated pads 808 of the LGA package 802. As shown in FIG. 9, the LGA package 802 sits on top of the elastomer interposer 502 with single-sided conductive bumps 810. Furthermore, the LGA package 802, elastomer interposer 502 and PCB 812 can be held in place and affixed together by a guiding mechanism (not shown) and a clamping mechanism (not shown), for the purpose of a firm electrical contact, This application can be part of an electrical socket for LGA package 802, to facilitate the LGA package 802 mounting on the PCB, or to be a test socket for testing the performance of the LGA package 802. It is very convenient to assemble or disassemble the LGA package 802 and elastomer interposer 502 with single-sided conductive bumps 810, since they are not permanent soldered to each other.

EXAMPLE 4

Figure 10:
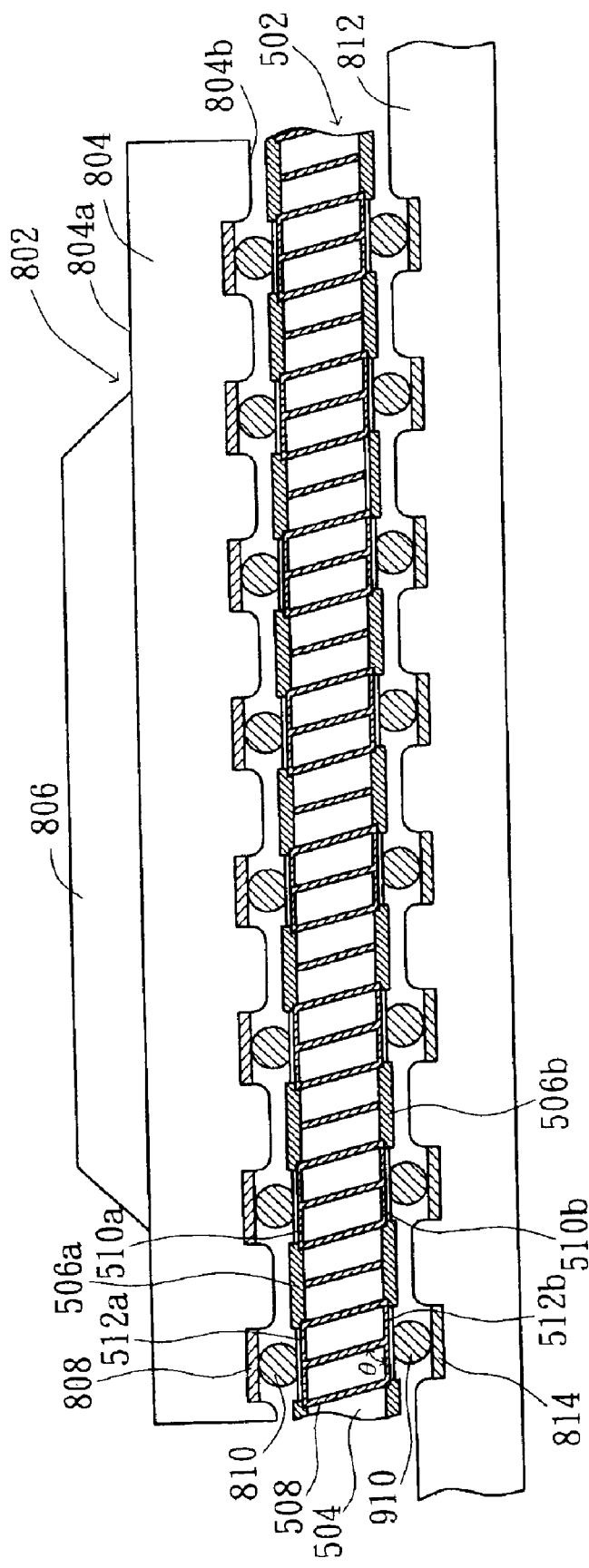
FIG. 10 is a cross-sectional drawing of the elastomer interposer employed between the PCB and LGA package according to example 4 of the first embodiment of the invention.

FIG. 10 is a cross-sectional drawing of the elastomer interposer employed between the PCB and LGA package according to example 4 of the first embodiment of the invention. The differences between example 3 and example 4 are: the elastomer interposer in example 4 has double-sided conductive bumps. In FIG. 10, numerous conductive bumps 910 were further formed on the Ni/Au plated pads 512b of the elastomer interposer 502 and electrically connected to the pads 814 of PCB 812 by direct electrical contact instead of soldering. Accordingly, it is very convenient to mount or dismount the elastomer interposer 502 on the PCB 812 since they are not permanent soldered to each other. Similarly, the LGA package 802, elastomer interposer 502 and PCB 812 can be held in place and affixed together by a guiding mechanism (not shown) and a clamping mechanism (not shown), for the purpose of electrical contact. This application can be part of an electrical socket for LGA package 802, to facilitate the LGA package 802 mounting on the PCB, or to be a test socket for testing the performance of the LGA package 802.

EXAMPLE 5

Figure 11:
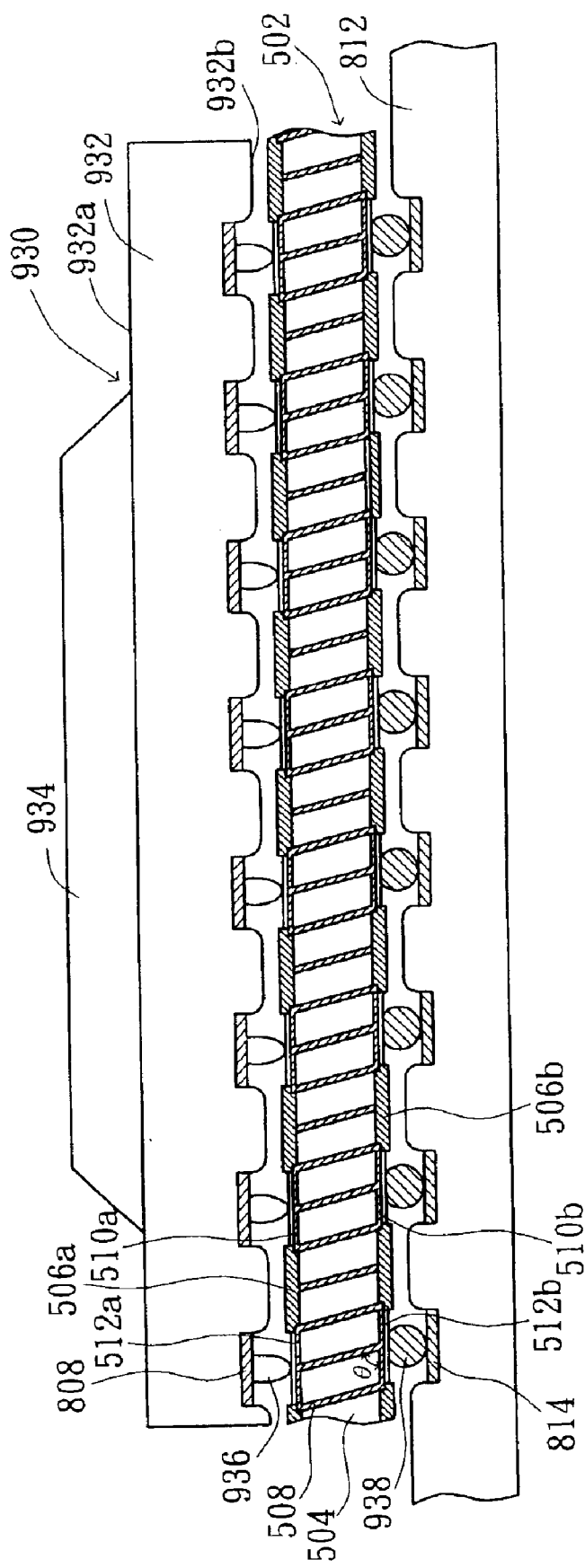
FIG. 11 is a cross-sectional drawing of the elastomer interposer employed between the PCB and CGA package according to example 5 of the first embodiment of the invention.

FIG. 11 is a cross-sectional drawing of the elastomer interposer employed between the PCB and CGA package according to example 5 of the first embodiment of the invention. In FIG. 11, the CGA (column grid array) package 930 includes a CGA substrate 932 and a molding compound 934. The molding compound 934 is formed over the top surface 932a of the CGA substrate 932 and numerous metal rods 936 are disposed on the bottom surface 932b of the CGA substrate 932. The metal rods 936 could be soldered to the Ni/Au plated pads 512a of the elastomer interposer 502 to make an electrical connection between the elastomer interposer 502 and CGA package 930. Also, the numerous conductive bumps 938 were formed on the Ni/Au plated pads 512b of the elastomer interposer 502 and electrically connected to the pads 814 of the PCB 812. Furthermore, the CGA package 930, elastomer interposer 502 and PCB 812 can be held in place and affixed together by a guiding mechanism (not shown) and a clamping mechanism (not shown), for the purpose of electrical contact. Simply saying, the electrical connection between CGA package 930 and PCB 812 has been achieved by contacting the metal rods 936 with the Ni/Au plated pads 512a.

According to the descriptions in the first embodiment, the elastomer interposer of the invention provides several methods for mounting the GA package on the PCB. For example, the GA package can be either soldered onto the elastomer interposer for a permanent electrical contact or being affixed together for a temporary electrical contact through the use of the solder balls, conductive bumps or metal rods, so does the connection between the elastomer interposer and the PCB. The invention herein can be used for many types of area array package. Under a series of high temperature thermal treatments, the elastomer interposer of the invention employed between the package and PCB allows reliable electrical connection without the concern of thermal cycle reliability failure.

Second Embodiment

FIG. 12A is a cross-sectional drawing of an elastomer interposer according to the second embodiment of the invention. The elastomer interposer 942 includes an elastomer 944, the solder resistant layers (insulating layers) 946a and 946b, numerous conductive wires 948, the conductive pads and solder ball pads, wherein the conductive pads could be the Cu pads 950a and 950b, the solder ball pads could be the Ni/Au plated pads 952a and 952b. The elastomer 944 having the top surface 945a and bottom surface 945b in parallel provides the flexibility of elastomer interposer 942. The solder resistant layer 946a with its opening surrounding the Ni/Au plated pads 952a are on the top surface 945a of the elastomer 944, while the solder resistant layer 946b with its opening surrounding and the Ni/Au plated pads 952b are on the bottom surface 945b of the elastomer 944. Also, the Cu pads 950a are covered by and electrically connected to the Ni/Au plated pads 952a, while the Cu pads 950b are covered by and electrically connected to the Ni/Au plated pads 952b. The solder resistant layers 946a and 946b not only have insulating function across the different pads, but also protect the inner structure of the elastomer interposer 942.

The solder resistant layers 946a and 946b can be made of any organic insulating ink or coating, with high temperature endurance (at about 250° C. for 30 secs) and water resistant.

There are a few differences in the configuration of the first and second embodiments. In the second embodiment, the surface where the Cu pads 950a and Ni/Au plated pads 952a interface reaches almost the same level with the top surface 945a (the interface between the solder resistant layers 946a and the elastomer). Similarly, the surface where the Cu pads 950b and Ni/Au plated pads 952b interface reaches almost the same level with the top surface 945b (the interface between the solder resistant layers 946b and the elastomer). The other components are arranged as in the first embodiment. The conductive wires 948 are arranged parallel at a certain interval, and the tilts between the conductive wires 948 and bottom surface 945b are kept in an angle of β; accordingly, the tilted conductive wires 948 are orderly aligned in the elastomer 944. Each Cu pad 950a is electrically connected to the corresponding Cu pad 950b by several conductive wires 948 between them, usually 3~6 wires. The elastomer 944 is made by the matter selected from the group consisting of silicon rubber compound, polyurethane compound, polyethylene compound, synthetic rubber, polysiloxane resin compound, acrylic compound or polyolefins compound.

FIG. 12B is a top view of the elastomer interposer in FIG. 12A. In FIG. 12B, the Ni/Au plated pads 952a forms a full pad matrix in the openings of the solder resistant layer 946a. Similarly, the Ni/Au plated pads 952b forms a full pad matrix on the openings of the solder resistant layer 946b. Alternatively, the Ni/Au plated pads 947 could form a partial matrix without pads in the center area of the elastomer interposer 943, as shown in FIG. 12C.

Figure 13A:
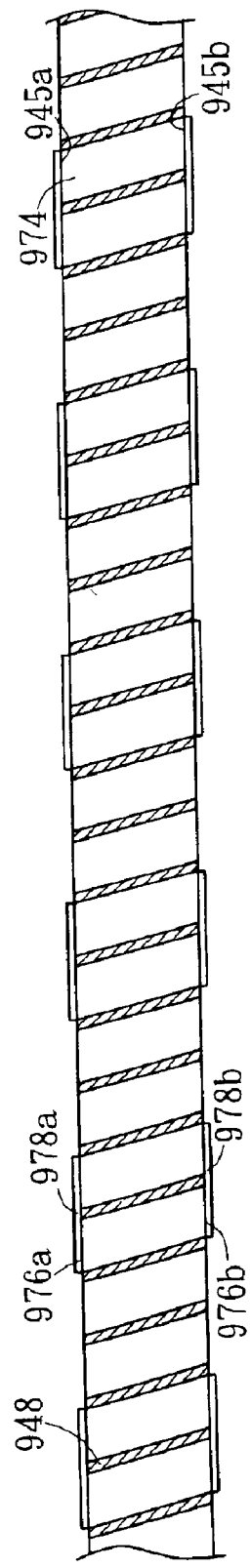
FIG. 13F illustrates a manufacturing process of the elastomer interposer of FIG. 12A.

FIG. 13A~FIG. 13F illustrates a manufacturing process of the elastomer interposer of FIG. 12A. First, a bare anisotropically conducting elastomer 974 with numerous conductive wires 948 therein is provided, as shown in FIG. 13A. The photo-resist (PR) is deposited over the top surface 945a and the bottom surface 945b of the elastomer 974, followed by exposure and development. The PR patterns 978a and 978b are thus formed, and the hollow areas correspond to the ball (Cu) pad areas to be plated.

Figure 13B:
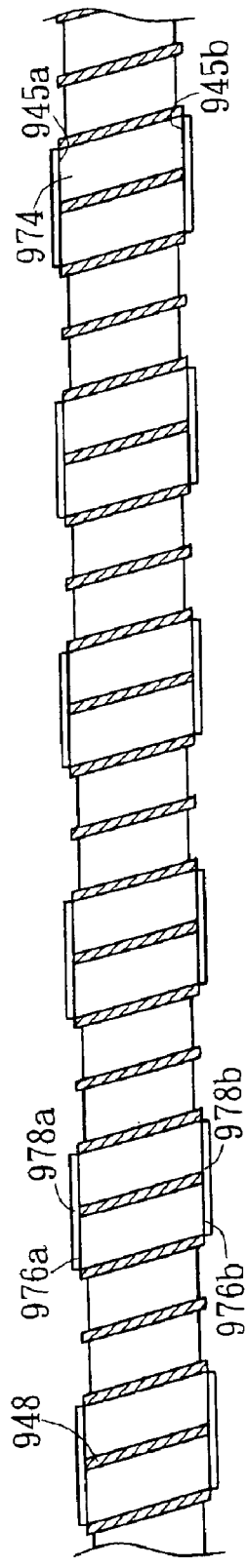

Then, the exposed top surface 945a and bottom surface 945b (the portions not covered by the PR patterns 978a and 978b) of the elastomer 974 are etched by chemical etching for about 50 μm thickness, and two ends of the conductive wires 948 protrude from the patterned, etched elastomer surfaces, as shown in FIG. 13B. Moreover, a surface clean or a pre-treatment process could be performed after chemical etching to remove any remaining organic residues or oxidized layer on the conductive wires 948 and the elastomer 974. The patterned photo-resist layer 978a and 978b still remains as is after the surface treatment.

Figure 13C:
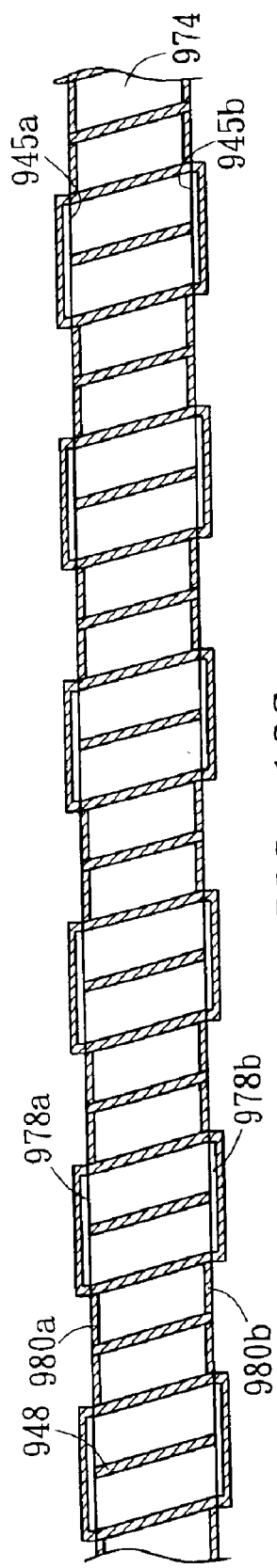

Subsequently, chemical Cu plating is performed on the elastomer 974 to form the plated Cu layers 980a and 980b, as shown in FIG. 13C. The plated Cu layer 980a covers the exposed top surface 945a and the PR pattern 978a, and the plated Cu layer 980b covers the exposed bottom surface 945b and the PR pattern 978b. Both of plated Cu layers 980a and 980b are electrically connected with the conductive wires 948.

Figure 13D:
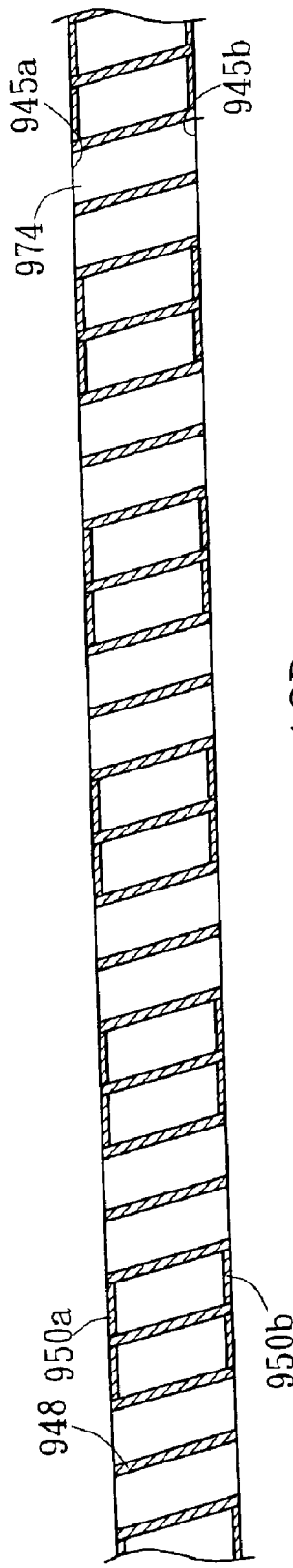

As shown in FIG. 13D, the removal of PR patterns 978a and 978b is then performed. The Cu layers 980a and 980b plated on top of the PR patterns 978a and 978b are also peeled off and removed (known as a lift-off process); thus, the Cu pads 950a and 950b are formed on the top surface 945a and the bottom surface 945b of the elastomer 974. The Cu pads 950a are arranged at certain interval and electrically connected to the conductive wires 948, so are the Cu pads 950b on the opposite elastomer surface. Each Cu pad 950a is electrically connected to a corresponding Cu pad 950b by conductive wires 948, usually 3~5 wires.

Figure 13E:
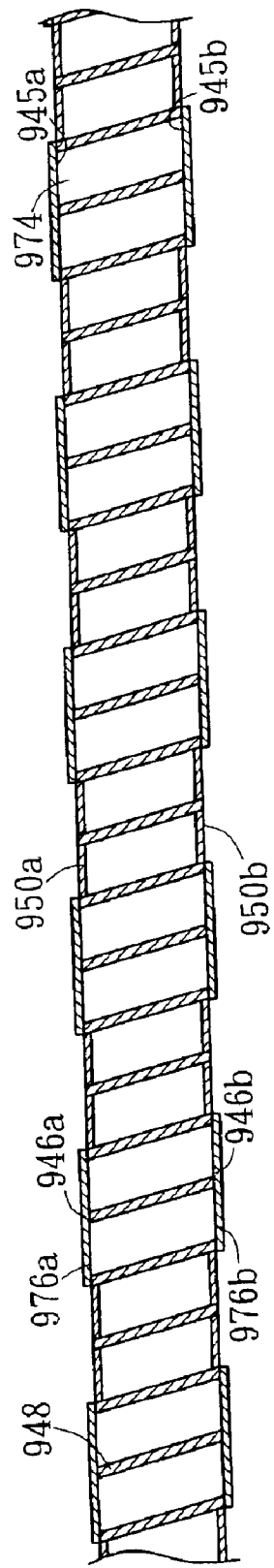

Afterward, a solder resistant layer (insulating layer) 946a is formed over the pads intervals (original positions of PR pattern 976a) between the Cu pads 950a, and a solder resistant layer 946b is formed over the pad intervals (original positions of PR pattern 976b) between the Cu pads 950b. As shown in FIG. 13E, the solder resistant layer 946a with openings surrounding the Cu pads 950a are the top surface 945a, and the solder resistant layer 946b with openings surrounding the Cu pads 950b are on the bottom surface 945b. Additionally, the solder resistant layers 946a and 946b of the invention can be coated on the elastomer 974 by stencil printing or other method with liquid type ink, followed by a dry process.

Figure 13F:
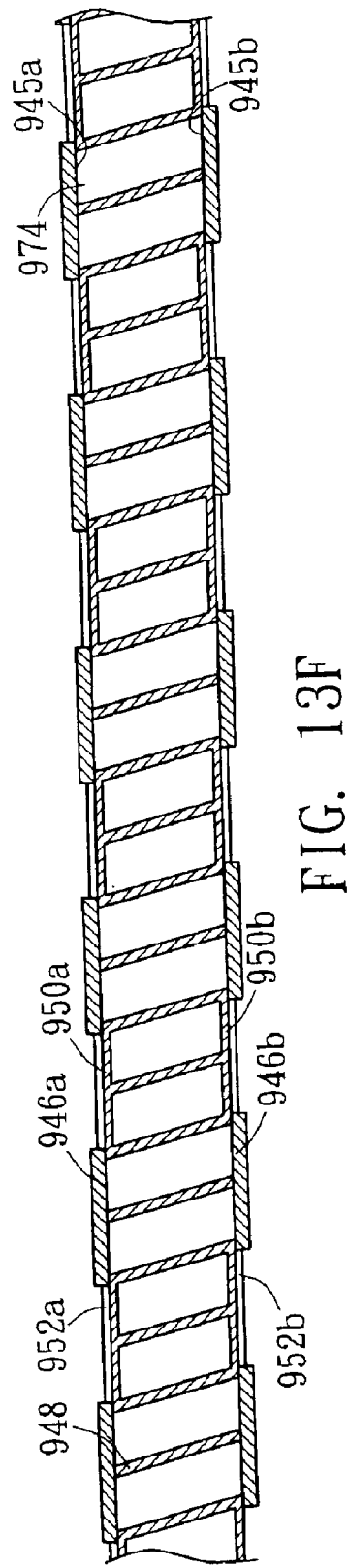

Then, the Ni/Au plated pads 952a and 952b are respectively formed on the Cu pads 950a and 950b by Ni/Au plating, and a large sheet of uncut elastomer interposer 982 is produced, as shown in FIG. 13F. The Ni/Au plated pads 952a electrically contact with the Cu pads 950a thereunder, and the Ni/Au plated pads 952b electrically contact with the Cu pads 950b thereunder. After singulation (to form desired pieces from a larger sheet) and inspection, a smaller piece like the elastomer interposer 942 of FIG. 12A is obtained.

In the second embodiment, the flexible elastomer 944 and tilted conductive wires 948 of the elastomer interposer 942 provide a good support for the package. The elastomer interposer 942 disclosed herein functions as a strain reliever for the solder balls between the package and the PCB, thus greatly enhance the reliability of the package against thermal cycle failure and external force destruction. The applications of elastomer interposer 942 of the second embodiment are as various as the first embodiment is. The GA package can be either soldered onto the elastomer interposer 942 for a permanent electrical contact or being affixed onto for a temporary electrical contact by the solder balls, conductive bumps or metal rods, so are the connection of elastomer interposer 942 and PCB. The details are similar to the examples 1~5 and will not be further described here.

According to the aforementioned description in the first and second embodiments, the elastomer interposer of the present invention facilitates electrical connection between the package and PCB, and protects the components in the package from the external force destruction with its flexible elastomer and tilted anisotropically conductive wires design. Also, the elastomer interposer functions as a strain reliever for the solder balls between the package and the PCB, thus greatly enhance the reliability of the package against thermal cycle failure. Also, numerous conductive wires connect the upper Cu pads and lower Cu pads so that the elastomer interposer employed between the package and PCB has an excellent electrical connection. Besides, the elastomer interposer could be connected to the package and PCB by the solder balls or the conductive bumps. The package can be either soldered onto the elastomer interposer for a permanent electrical contact, or being affixed onto for a temporary electrical contact, depending on the package type and applied PCB. Furthermore, the invention can be part of an electrical socket for GA package for mounting the package on the PCB, or be part of a test socket for testing the performance of the package. It is very convenient to assemble or disassemble the package to and from the elastomer interposer since they are not permanent soldered to each other.

While the invention has been described by ways of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An elastomer interposer, employed between a package and a printed circuit board, comprising:
   an elastomer, having a first surface and a second surface;
   a plurality of conductive wires, arranged inside the elastomer at a certain interval and tilted toward the second surface with an inclined angle;
   a plurality of first Cu pads, formed on the first surface at a space and electrically connected to the corresponding conductive wires;
   a plurality of second Cu pads, formed on the second surface at the space and electrically connected to the corresponding conductive wires;
   a plurality of first solder resistant blocks, having openings surrounding the first Cu pads, are on the first surface;
   a plurality of second solder resistant blocks, having openings surrounding the second Cu pads, are on the second surface;
   a plurality of first Ni/Au plated pads, formed on outer surface of the first Cu pads; and
   a plurality of second Ni/Au plated pads, formed on outer surface of the second Cu pads.

2. The elastomer interposer according to claim 1 further comprises a plurality of first conductive bumps attached to the first Ni/Au plated pads.

3. The elastomer interposer according to claim 2, wherein the elastomer interposer is electrically connected to the PCB by contacting with the first conductive bumps.

4. The elastomer interposer according to claim 3, wherein the package is a ball grid array (BGA) package, and electrically connected to the elastomer interposer by soldering a plurality of first solder balls onto the second Ni/Au plated pads.

5. The elastomer interposer according to claim 3, wherein the package is a column grid array (CGA) package, and electrically connected to the elastomer interposer by soldering a plurality of first metal rods onto the second Ni/Au plated pads.

6. The elastomer interposer according to claim 2, wherein the package is a first land grid array (LGA) package, and electrically connected to the elastomer interposer by contacting with the first conductive bumps.

7. The elastomer interposer according to claim 6, wherein a plurality of third solder balls attached to the second Ni/Au plated pads are soldered to the PCB pads, so as to achieve the electrical connection between the elastomer interposer and PCB.

8. The elastomer interposer according to claim 2 further comprises a plurality of second conductive bumps attached to the second Ni/Au plated pads.

9. The elastomer interposer according to claim 8, wherein the package is a second land grid array (LGA) package, and electrically connected to the elastomer interposer by contacting the first conductive bumps.

10. The elastomer interposer according to claim 8, wherein the elastomer interposer is electrically connected to the PCB by contacting the second conductive bumps with the PCB pads.

11. The elastomer interposer according to claim 1 further comprises a plurality of fourth solder balls attached to the first Ni/Au plated pads.

12. The elastomer interposer according to claim 11, wherein the elastomer interposer is electrically connected to PCB by soldering the fourth solder balls onto the PCB pads.

13. The elastomer interposer according to claim 12, wherein the package is a ceramic ball grid array (CBGA) package, and electrically connected to the elastomer interposer by soldering a plurality of fifth solder balls onto the second Ni/Au plated pads.

14. The elastomer interposer according to claim 13, wherein coefficient of thermal expansion (CTE) of the CBGA package is approximately 8 ppm/° C., and CTE of the PCB is approximately 18 ppm/° C.

15. The elastomer interposer according to claim 12, wherein the package is a plastic ball grid array (PBGA) package, and electrically connected to the elastomer interposer by soldering a plurality of sixth solder balls onto the second Ni/Au plated pads.

16. The elastomer interposer according to claim 15, wherein CTE of the PBGA package is approximately 18 ppm/° C., and CTE of the PCB is approximately 5~10 ppm/° C.

17. The elastomer interposer according to claim 1, wherein the material of the elastomer is selected from the group consisting of silicon rubber compound, polyurethane compound, polyethylene compound, synthetic rubber, polysiloxane resin compound, acrylic compound and polyolefins compound.

* * * * *